United States Patent
Chen et al.

(10) Patent No.: US 11,895,753 B2
(45) Date of Patent: Feb. 6, 2024

(54) MOTION-ACTIVATED SWITCH CONTROL BASED ON OBJECT DETECTION

(71) Applicant: Synaptics Incorporated, San Jose, CA (US)

(72) Inventors: Beichen Chen, Sichuan (CN); Thavatchai Montreevat, Irvine, CA (US); Vineet Ganju, Tustin, CA (US); Rui Qiao, Sichuan (CN)

(73) Assignee: Synaptics Incorporated, San Jose, CA (US)

( * ) Notice: Subject to any disclaimer, the term of this patent is extended or adjusted under 35 U.S.C. 154(b) by 116 days.

(21) Appl. No.: 17/567,433

(22) Filed: Jan. 3, 2022

(65) Prior Publication Data

US 2023/0217571 A1   Jul. 6, 2023

(51) Int. Cl.
| | |
|---|---|
| *H05B 47/115* | (2020.01) |
| *H04N 7/18* | (2006.01) |
| *G06V 20/52* | (2022.01) |
| *G06V 40/10* | (2022.01) |
| *H03K 17/94* | (2006.01) |
| *H04N 23/65* | (2023.01) |
| *H01H 47/00* | (2006.01) |

(52) U.S. Cl.
CPC .......... *H05B 47/115* (2020.01); *G06V 20/52* (2022.01); *G06V 40/10* (2022.01); *H03K 17/94* (2013.01); *H04N 7/188* (2013.01); *H04N 23/651* (2023.01); *H01H 47/002* (2013.01)

(58) Field of Classification Search
CPC ...... H05B 47/115; G06V 20/52; G06V 40/10; H03K 17/94; H04N 7/188; H04N 23/651; H01H 47/002
See application file for complete search history.

(56) References Cited

U.S. PATENT DOCUMENTS

| | | | | |
|---|---|---|---|---|
| 10,997,837 | B1* | 5/2021 | Skotty | G08B 13/19695 |
| 2016/0027262 | A1* | 1/2016 | Skotty | G08B 13/19695 340/541 |
| 2016/0227628 | A1* | 8/2016 | Lydecker | H05B 47/12 |
| 2018/0288850 | A1* | 10/2018 | Kumar | G01J 5/0022 |
| 2019/0188492 | A1* | 6/2019 | Kaestle | G06V 20/53 |
| 2019/0220728 | A1* | 7/2019 | Lu | H05B 45/10 |
| 2019/0306960 | A1* | 10/2019 | Cho | H05B 47/19 |
| 2019/0313511 | A1* | 10/2019 | Trice | H05B 47/11 |

(Continued)

*Primary Examiner* — Fernando Alcon
(74) *Attorney, Agent, or Firm* — Paradice & Li LLP (57) ABSTRACT

This disclosure provides methods, devices, and systems for controlling motion-activated switches. The present implementations more specifically relate to relay controller that prevent motion-activated switches from turning off devices associated with an environment in which people are present. In some aspects, a motion-activated switch may include a relay controller coupled to a motion sensor, a camera, and a relay. The motion sensor outputs a motion trigger to the relay controller responsive to detecting motion in an environment. The motion trigger may cause the relay controller to acquire one or more images of the environment, via the camera, and selectively toggle the relay based on the acquired images. For example, the relay controller may close the relay responsive to identifying an image that includes an object of interest or may open the relay controller may open the relay responsive to identifying an image that does not include an object of interest.

16 Claims, 9 Drawing Sheets

(56) References Cited

U.S. PATENT DOCUMENTS

| | | | |
|---|---|---|---|
| 2020/0128646 A1* | 4/2020 | Sinha | H05B 1/028 |
| 2020/0221558 A1* | 7/2020 | Liu | H05B 47/11 |
| 2020/0253023 A1* | 8/2020 | Bedell | H05B 47/11 |
| 2020/0305258 A1* | 9/2020 | Zhao | G06V 40/103 |
| 2020/0352003 A1* | 11/2020 | Lark, Jr. | H05B 47/115 |
| 2021/0174095 A1* | 6/2021 | Kong | G08B 3/10 |
| 2021/0383556 A1* | 12/2021 | Steiner | G01S 5/0294 |
| 2022/0210894 A1* | 6/2022 | Cohen | H05B 47/19 |

* cited by examiner

MOTION-ACTIVATED SWITCH CONTROL BASED ON OBJECT DETECTION

TECHNICAL FIELD

The present implementations relate generally to motion-activated switches, and specifically to controlling motion-activated switches based on object detection.

BACKGROUND OF RELATED ART

Motion-activated switches rely on motion triggers to toggle power to various devices (such as lights or other appliances). A motion-activated switch may include a relay and a motion sensor (such as a passive infrared (PIR) or microwave (MW) sensor). The motion sensor outputs an activation signal responsive to detecting motion (such as a moving object) in its field-of-view (FOV). The activation signal causes the relay to close, thereby coupling one or more devices to a power supply. As such, the motion-activated switch may "turn on" the devices coupled thereto. For example, a motion-activated light switch may turn on one or more lights in a room responsive to detecting a person entering the room.

Many motion-activated switches are controlled by timers, for example, to reduce power consumption. The timer initiates a countdown when the motion sensor of a motion-activated switch outputs an activation signal. If the motion sensor outputs a subsequent activation signal before the countdown expires, the timer is reset, and the countdown is restarted. When the countdown expires, the motion-activated switch opens the relay, thereby decoupling the one or more devices from the power supply. As such, the motion-activated switch may "turn off" the devices coupled thereto. More specifically, the timer may prevent unnecessary power consumption by devices in an area where people are not present.

The motion sensors associated with motion-activated switches generally have limited range and sensitivity. As such, a motion-activated switch may not be able to detect subtle movements (such as a person typing on a computer) or movements of objects beyond a threshold range (such as a person located on an opposite side of the room from the motion-activated switch). Motion-activated switches also may not be able to detect stationary objects (such as persons standing or sitting still). Thus, in some instances, a motion-activated switch that is controlled by a timer may turn off its associated devices even though people may still be present in the environment (although not detected by the motion sensor). Thus, new switch designs are needed to avoid turning off devices in areas where people are still present.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter of this disclosure can be implemented in a method performed by a relay controller. The method includes steps of receiving a motion trigger indicating that motion is detected in an environment; obtaining one or more images of the environment based on the motion trigger; performing an object detection operation that indicates whether the one or more images include an object of interest; and selectively toggling a relay coupled to one or more devices associated with the environment based at least in part on the object detection operation.

Another innovative aspect of the subject matter of this disclosure can be implemented in a relay controller that includes a processing system and a memory. The memory stores instructions that, when executed by the processing system, cause the relay controller to receive a motion trigger indicating that motion is detected in an environment; obtain one or more images of the environment based on the motion trigger; perform an object detection operation that indicates whether the one or more images include an object of interest; and selectively toggle a relay coupled to one or more devices associated with the environment based at least in part on the object detection operation.

Another innovative aspect of the subject matter of this disclosure can be implemented in system including a relay coupled to one or more devices associated with an environment, a motion sensor configured to detect motion in the environment, and a camera configured to capture images of the environment. The system further includes a relay controller configured to receive, from the motion sensor, a motion trigger indicating that motion is detected in the environment; obtain, via the camera, one or more images of the environment responsive to receiving the motion trigger; performing an object detection operation that indicates whether the one or more images include an object of interest; and selectively toggle the relay based at least in part on the object detection operation.

BRIEF DESCRIPTION OF THE DRAWINGS

The present implementations are illustrated by way of example and are not intended to be limited by the figures of the accompanying drawings.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

Various aspects relate generally to motion-activated switches, and more particularly, to relay controllers that prevent motion-activated switches from turning off devices associated with an environment in which people are present. In some aspects, a motion-activated switch may include a relay controller coupled to a motion sensor, a camera, and a relay. The motion sensor outputs a motion trigger to the relay controller responsive to detecting motion in an environment. In some implementations, the motion trigger may cause the relay controller to acquire one or more images of the environment, via the camera, and selectively toggle the relay based on the acquired images. More specifically, the relay controller may analyze the images for objects of interest. As used herein, the term "object of interest" refers to any object (such as a person) whose presence in the environment causes the motion-activated switch to turn on one or more devices coupled to the relay (such as lights or other appliances). For example, the relay controller may close the relay, thereby coupling the devices to a power supply, responsive to identifying an image that includes an object of interest. On the other hand, the relay controller may open the relay, thereby decoupling the devices from the power supply, responsive to identifying an image that does not include an object of interest.

Particular implementations of the subject matter described in this disclosure can be implemented to realize one or more of the following potential advantages. Aspects of the present disclosure may improve user experience associated with motion-activated switches by selectively toggling a relay coupled to one or more devices based on images captured of the surrounding environment. As described above, existing motion-activated switches may fail to detect people that are relatively stationary or far away from their motion sensors. As a result, such motion-activated switches may turn off one or more devices associated with an environment even while people are still present in the environment. Aspects of the present disclosure recognize that image analysis can more accurately identify the presence of objects of interest in a given environment (such as through machine learning), particularly when the objects are stationary or relatively far from the motion-activated switch. Thus, by controlling the opening and closing of the relay based on captured images, the relay controller of the present implementations may reduce false triggers in motion-activated switches and avoid turning off devices associated with an environment in which people are present.

Figure 1:
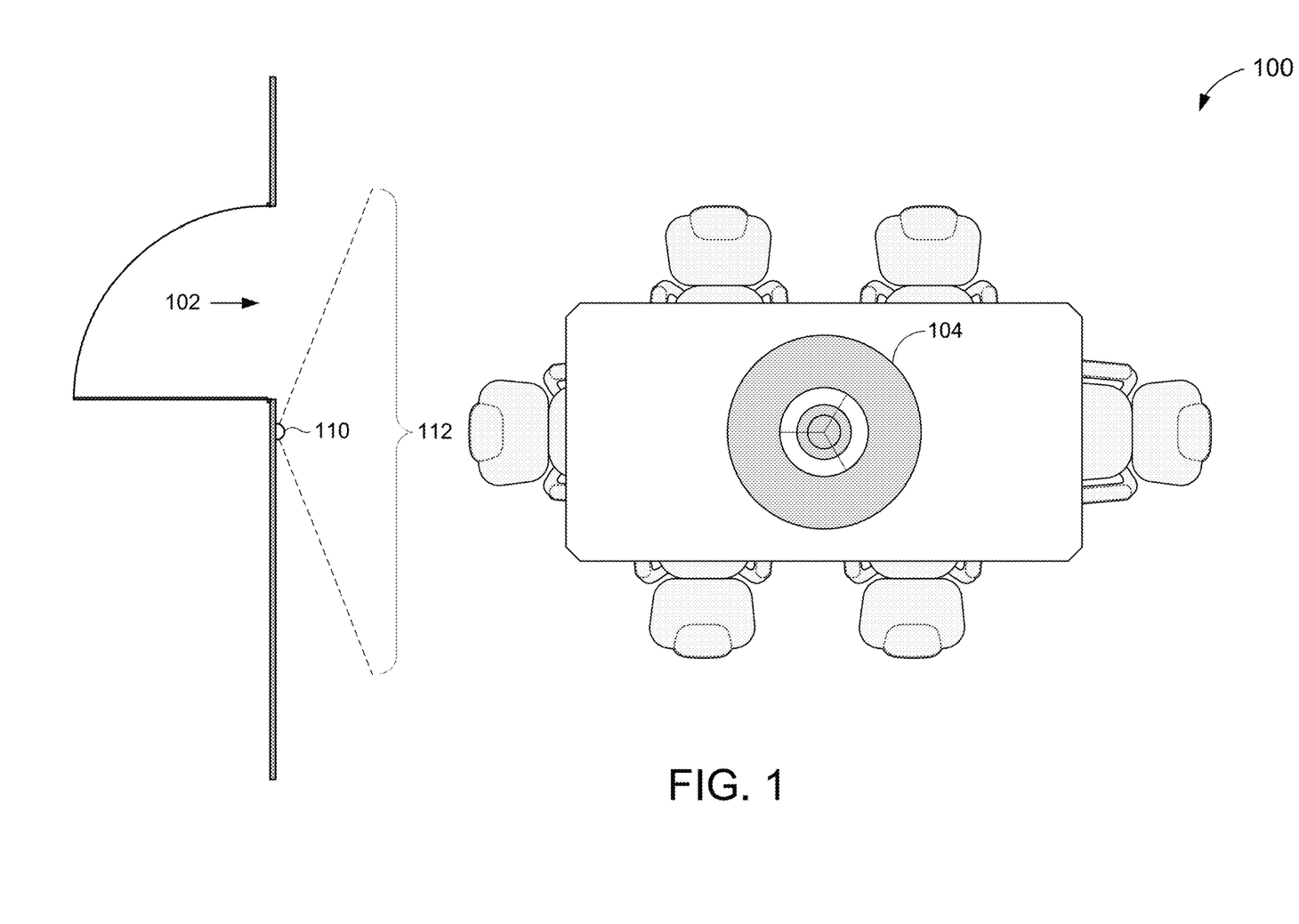
FIG. 1 shows an example environment that can be monitored by a motion-activated switch.

FIG. 1 shows an example environment 100 that can be monitored by a motion-activated switch 110. In the example of FIG. 1, the environment 100 is depicted as a room or office that includes overhead lighting 104. In some implementations, the motion-activated switch 110 may be positioned by an entrance 102 to the environment (such as a doorway) and configured to control one or more devices or appliances associated with the environment 100 (such as the overhead lighting 104) based on a presence or absence of objects of interest in the environment 100.

In some aspects, the motion-activated switch 110 may include an image capture component and a motion sensing component having a field-of-view (FOV) 112 that encompasses at least part of the environment 100. More specifically, the motion sensing component may generate a motion trigger or activation signal responsive to detecting movement in its FOV 112. In some implementations, the motion-activated switch 110 may capture one or more images of the environment 100, via the image capture component, in response to a motion trigger and may turn the overhead lighting 104 (or other devices associated with the environment 100) on or off based, at least in part, on the captured images. More specifically, the motion-activated switch 110 may analyze the captured images to determine whether an object of interest (such as a person) is present in the environment 100.

In some implementations, the motion-activated switch 110 may turn on the overhead lighting 104 in response to determining that at least one of the captured images includes an object of interest. In contrast with existing motion-activated switches, the motion-activated switch 110 does not directly activate the overhead lighting 104 in response to the motion trigger. Rather, the motion trigger causes the motion-activated switch 110 to capture images of the environment 100 and analyze the captured images for objects of interest. More specifically, the motion-activated switch 110 may turn on the overhead lighting 104 only if it captures one or more images showing that an object of interest is currently present in the environment 100.

In some implementations, the motion-activated switch 110 may turn off the overhead lighting 104 in response to determining that at least one of the captured images does not include an object of interest. In contrast with existing motion-activated switches, the motion activated switch 110 does not rely on a timer or countdown to turn off the overhead lighting 104. Instead, the motion-activated switch 110 analyzes the captured images to determine whether any objects of interest are still present in the environment 100. More specifically, the motion-activated switch 110 may turn off the overhead lighting 104 only if it captures one or more images showing that no objects of interest are currently present in the environment 100.

Figure 2:
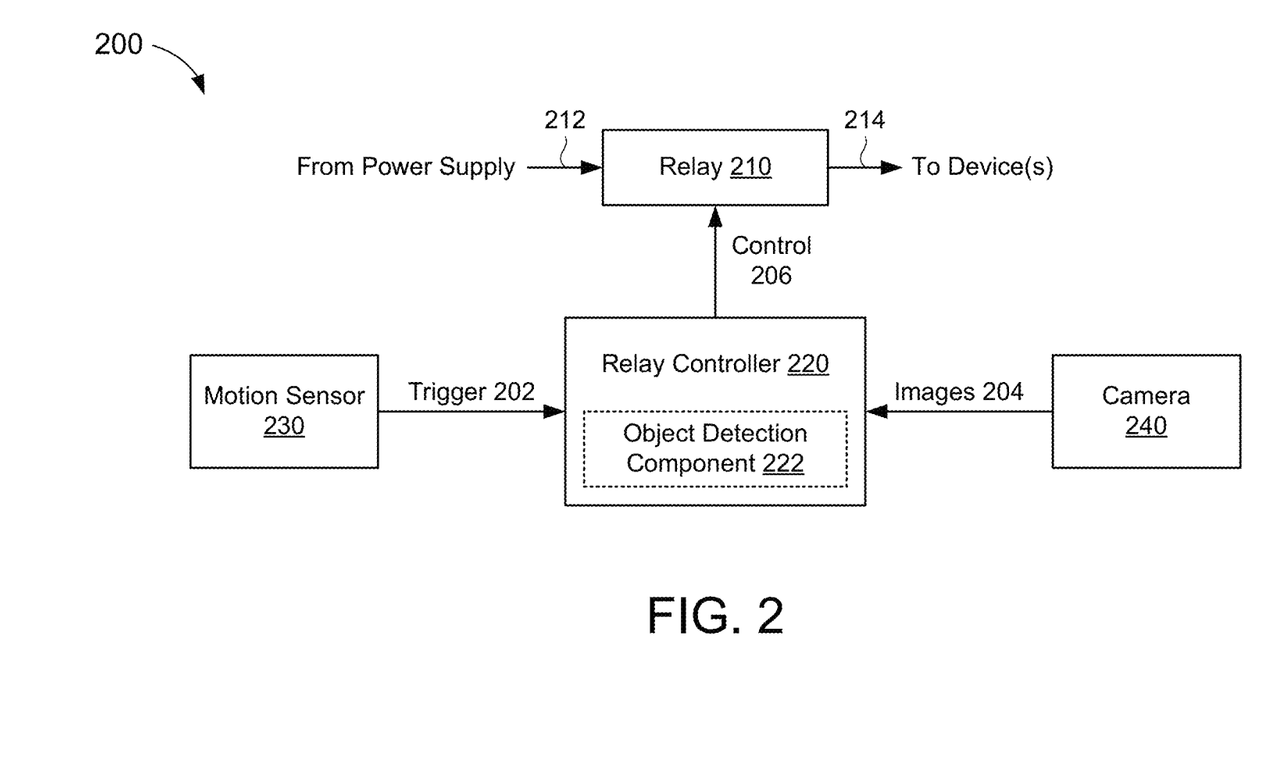
FIG. 2 shows a block diagram of a motion-activated switch, according to some implementations.

FIG. 2 shows a block diagram of a motion-activated switch 200, according to some implementations. In some implementations, the motion-activated switch 200 may be one example of the motion-activated switch 110 of FIG. 1. For example, the motion-activated switch 200 may be configured to control one or more devices or appliances (such as lighting) associated with an environment based on a presence or absence of one or more objects of interest in the environment.

The motion-activated switch 200 includes a relay 210, a relay controller 220, a motion sensor 230, and a camera 240. The motion sensor 230 may utilize any suitable motion-sensing technology to detect motion in its FOV. Example suitable motion sensors may include passive infrared (PIR) sensors, microwave (MW) sensors, area reflective sensors, or ultrasonic motion sensors, among other examples. The camera 240 may utilize any suitable image-capture technology to capture images of an environment. Example suitable cameras may include complementary metal-oxide-semiconductor (CMOS) image sensor arrays, charge-coupled device (CCD) arrays, or any other sensors capable of detecting wavelengths of light in the visible spectrum, the infrared spectrum, or the ultraviolet spectrum.

In some implementations, the relay 210 may include a first terminal 212 coupled to the power supply and a second terminal 214 coupled to one or more devices. With reference for example to FIG. 1, the second terminal 214 may be coupled to the overhead lighting 104 and the first terminal 212 may be coupled to a power supply (not shown for simplicity). The relay 210 can be toggled between a closed state and an open state to switchably couple the power supply to the one or more devices. In the closed state, the relay 210 forms a closed circuit between its terminals 212 and 214, thereby turning "on" the devices coupled to the second terminal 214. In the open state, the relay 210 forms an open circuit between its terminals 212 and 214, thereby turning "off" the devices coupled to the second terminal 214.

In some aspects, the relay controller 220 may control or toggle the relay 210 based, at least in part, on information received from the motion sensor 230 and the camera 240. More specifically, the motion sensor 230 may output a motion trigger 202 in response to detecting motion in a given environment. In some implementations, the motion trigger 202 may wake up the relay controller 220 from a low power or idle mode. The relay controller 220 may activate the camera 240 to capture one or more images 204 of the environment in response to receiving the motion trigger 202. In some implementations, the relay controller 220 may include an object detection component 222 to analyze the images 204 for objects of interest. More specifically, the object detection component 222 may perform an object detection operation that indicates whether an object of interest is detected in each of the images 204.

In some implementations, the object detection component 222 may include a neural processing unit (NPU) that can identify or infer objects of interest in the captured images 204 based on a neural network model. For example, the model can be "trained" by providing a neural network with a large volume of input images that contain objects of interest (such as images of people at various distances from a camera). The neural network analyzes the input images to "learn" a set of rules that can be used to identify various objects of interest in captured images. For example, the neural network may perform statistical analysis on the input images to determine a common set of rules (representing the neural network model) that can be associated with an object of interest.

In some implementations, the relay controller 220 may output a control signal 206 to the relay 210 based on the object detection operation. More specifically, the relay controller 220 may assert the control signal 206 if the object detection operation identifies an object of interest in at least one of the captured images 204 and may deassert the control signal 206 if the object detection operation fails to identify an object of interest in at least one of the captured images 204. In some implementations, the relay controller 220 may enter (or re-enter) a low power mode after a threshold duration has elapsed. When entering the low power mode, the relay controller 220 may stop acquiring images 204 via the camera 240 and may hold or maintain the current (asserted or deasserted) state of the control signal 206.

The control signal 206 may toggle the relay 210 between the open state and the closed state. For example, the relay 210 may be closed (and remain closed) for as long as the control signal 206 is asserted. On the other hand, the relay 210 may be opened (and remain open) for as long as the control signal 206 is deasserted. As such, the relay controller 220 may open the relay 210 only if the object detection component 222 actively identifies one or more images 204 that do not include any objects of interest. In other words, when the relay 210 is closed, the relay 210 remains closed until the relay controller 220 acquires an image 204 that does not include any objects of interest. Similarly, when the relay 210 is open, the relay 210 remains open until the relay controller 220 acquires an image 204 that includes an object of interest.

Figure 3:
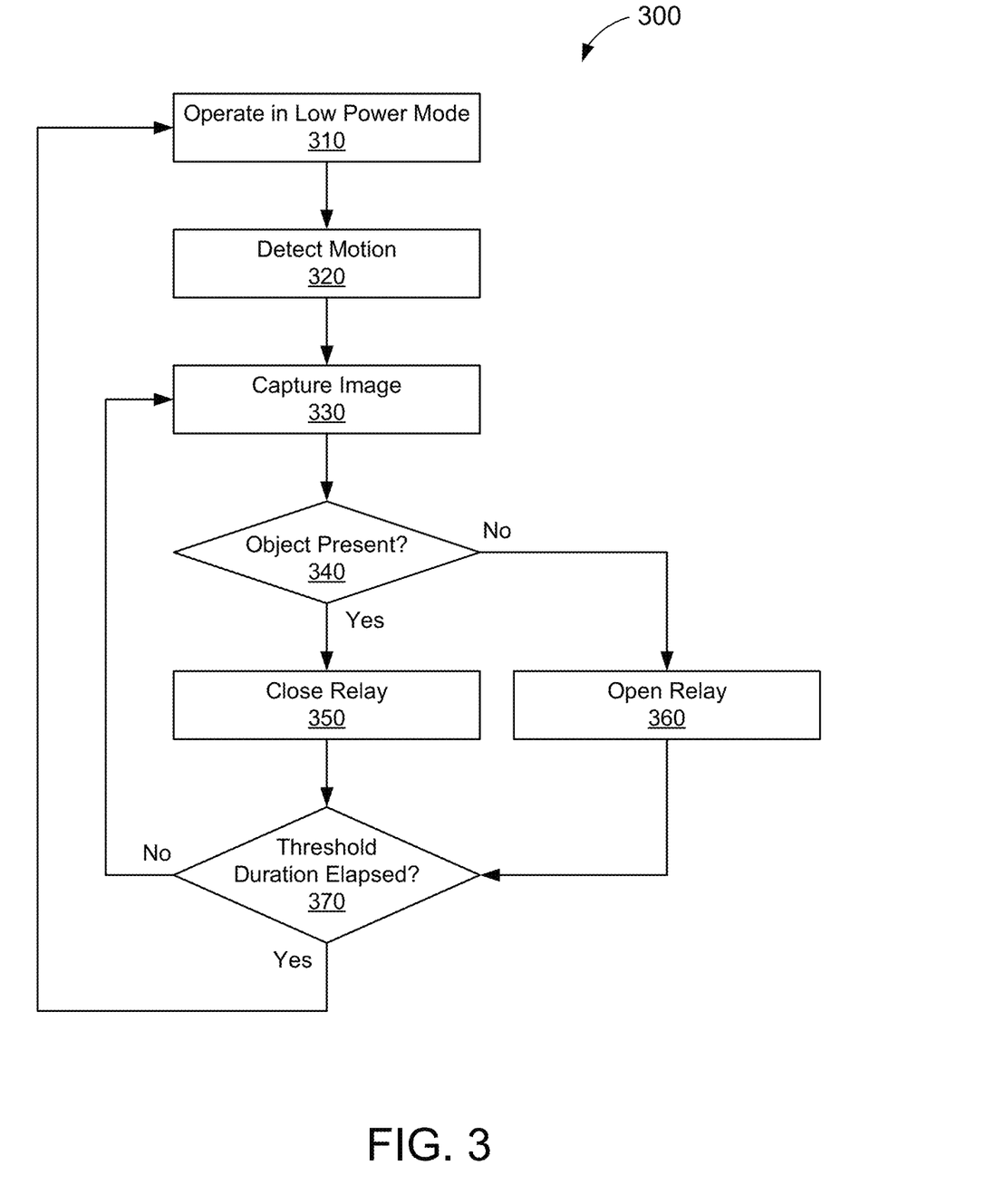
FIG. 3 shows an illustrative flowchart depicting an example operation of a motion-activated switch, according to some implementations.

FIG. 3 shows an illustrative flowchart depicting an example operation 300 of a motion-activated switch, according to some implementations. In some implementations, the motion-activated switch may be one example of the motion-activated switch 200 of FIG. 2.

The motion-activated switch initially operates in low power mode (310). For example, the camera 240 and one or more processors of the relay controller 220 may be inactive when the motion-activated switch 200 operates in the low power mode. When the motion-activated switch detects motion in the surrounding environment (320), the motion-activated switch proceeds to capture an image of the environment (330). For example, the motion sensor 230 may output a motion trigger 202 responsive to detecting motion in its FOV. The motion trigger 202 may activate one or more processors of the relay controller 220 which, in turn, activates the camera 240. Once activated, the camera 240 may begin capturing images (or frames of video) of the environment.

The motion-activated switch further determines whether one or more objects of interest are present in the captured image (340). For example, the object detection component 222 may perform an object detection operation that indicates whether the image includes an object of interest. If an object of interest is present in the captured image (at 340), the motion-activated switch may close its relay (350). For example, the relay controller 220 may assert the control signal 206, thereby causing the relay 210 to close or continue operating in a closed state. If no object of interest is present in the captured image (at 340), the motion-activated switch may open its relay (360). For example, the relay controller 220 may deassert the control signal, thereby causing the relay 210 to open or continue operating in an open state.

The motion-activated switch further determines whether a threshold duration has elapsed (370). As long as the threshold duration has not elapsed (at 370), the motion-activated switch may continue capturing images of the environment (330) and analyzing the images for objects of interest (340). Once the threshold duration has elapsed (at 370), the motion-activated switch may return to operating in the low power mode (310). As such, the motion-activated switch may stop capturing images of the environment or toggling the relay in response thereto. For example, the relay controller 220 may hold or maintain the last state of the control signal 206 prior to entering the low power mode. The motion-activated switch may remain in the low power mode (310) until subsequent motion is detected in the environment (320).

Figure 4A:
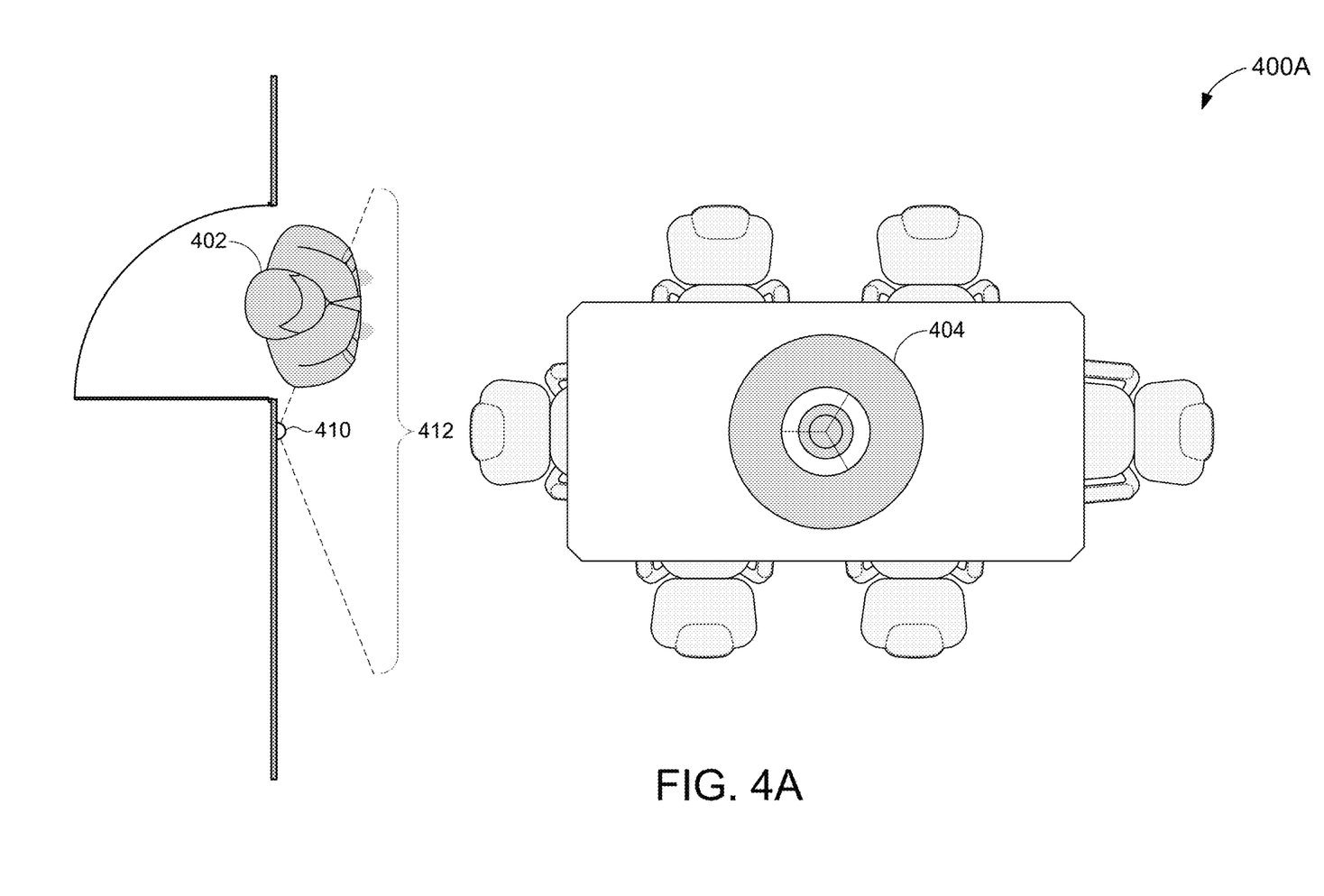
FIGS. 4A and 4B show example changes to an environment monitored by a motion-activated switch.
Figure 4B:
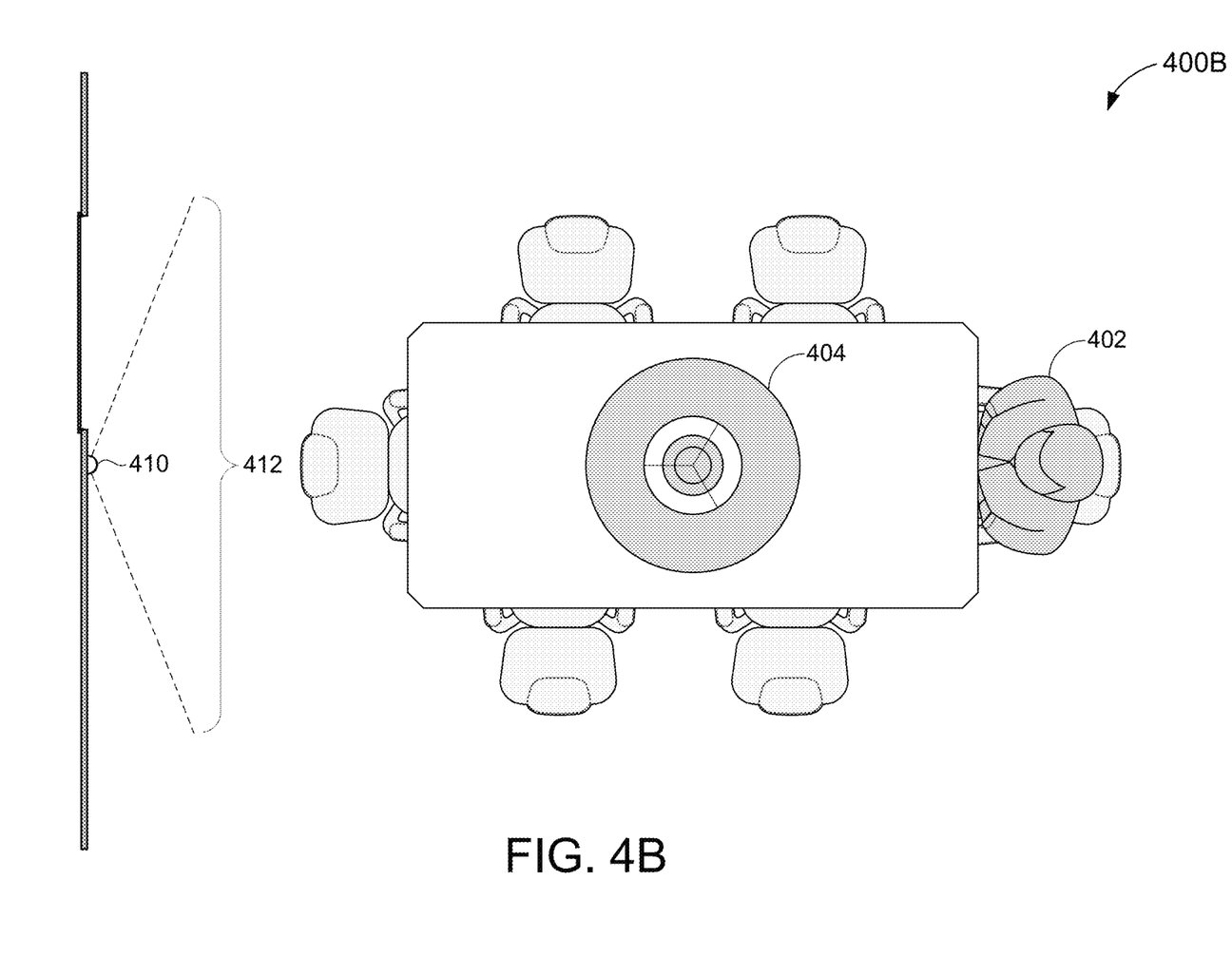

FIGS. 4A and 4B show example changes to an environment 400A and 400B, respectively, monitored by a motion-activated switch 410. The environment of FIGS. 4A and 4B may be one example of the environment 100 of FIG. 1. Thus, the motion-activated switch 410 may be positioned by an entrance to the environment (such as a doorway) and configured to control one or more devices or appliances associated with the environment based on a presence or absence of objects of interest in the environment.

In some implementations, the motion-activated switch 410 may be one example of the motion-activated switch 200 of FIG. 2. Thus, the motion-activated switch 410 may include an image capture component (such as the camera 240) and a motion sensing component (such as the motion sensor 230). The motion sensing component may generate a motion trigger in response to detecting movement in its FOV 412. In some implementations, the motion-activated switch 410 may capture one or more images of the environment, via the image capture component, in response to each motion trigger and may analyze the captured images for objects of interest. For example, a processor of the motion-activated switch 410 (such as the object detection component 222) may perform an object detection operation that indicates whether each of the captured images includes an object of interest.

In some aspects, the motion-activated switch 410 may control an overhead lighting 404 (or other devices associated with the environment) based on whether an object of interest is detected in the captured images. More specifically, the motion-activated switch 410 may turn on the overhead lighting 404 in response to determining that a captured image includes an object of interest and may turn off the overhead lighting 404 in response to determining that a captured image does not include any objects of interest (such as described with reference to FIGS. 2 and 3). For example, a processor of the motion-activated switch 200 (such as the relay controller 220) may toggle a relay coupled between a power supply and the overhead lighting 404 (such as the relay 210) by asserting or deasserting a control signal (such as the control signal 206) based on a result of the object detection operation.

With reference for example to FIG. 4A, a person 402 (or other object of interest) enters the environment via the doorway. Because this movement occurs within the FOV 412, the motion sensing component of the motion-activated switch 410 detects the movement of the person 402 and generates a motion trigger in response to detecting the movement. In some implementations, the motion trigger may wake up the motion-activated switch 410 from a low power mode. The motion-activated switch 410 activates the image capture component to begin capturing images of the environment in response to the motion trigger. In the example of FIG. 4A, the motion-activated switch 410 may detect the presence of the person 402 in at least one of the captured images. As a result, the motion-activated switch 410 may turn on the overhead lighting 404 when the person 402 enters the environment.

With reference for example to FIG. 4B, the person 402 moves to the far end of the environment (opposite the entryway) and sits down at a table or desk. For example, the person 402 may proceed to work or study at the table. In some implementations, the image capture component of the motion-activated switch 410 may continue capturing images of the environment for at least a threshold duration after the motion sensing component generates the motion trigger responsive to detecting the movement of the person 402 in its FOV 412 (such as described with reference to FIG. 4A).

In the example of FIG. 4B, the captured images may show the person 402 move to the far end of the room and sit down. As such, the motion-activated switch 410 may detect the person 402 in each of the captured images and may thus refrain from turning off the overhead lighting 404.

In some implementations, the motion-activated switch 410 may enter (or re-enter) a low power mode when the threshold duration elapses. Upon entering the low power mode, the motion-activated switch 410 may stop capturing images of the environment and may hold or maintain the current (open or closed) state of its relay at the time the motion-activated switch 410. In the example of FIG. 4B, the motion-activated switch 410 may enter the low power mode while the person 402 is seated at the far end of the environment. Further, the motion-activated switch 410 may determine that the person 402 is still present in the environment (based on the presence of the person 402 in the captured images) when entering the low power mode. As such, the motion-activated switch 410 may hold the relay in the closed position, thereby keeping the overhead lighting 404 on, while operating the low power mode.

As shown in FIG. 4B, the person 402 is beyond the FOV 412 of the motion sensing component of the motion-activated switch 410 while sitting at the table. As such, the motion sensing component may not be able to detect subsequent movements of the person 402. However, unlike existing motion-activated switches, the motion-activated switch 410 does not require continuous motion triggers to keep the overhead lighting 404 on. Rather, once the motion-activated switch 410 turns on the overhead lighting 404, it may keep the overhead lighting 404 on until it captures an image of the environment that does not include any objects of interest. Aspects of the present disclosure recognize that the motion-activated switch 410 may capture additional images when the person 402 exits the environment, where at least one of the images may show that the person 402 is no longer present in the environment.

For example, when exiting the environment, the person 402 may re-enter the FOV 412 of the motion sensing component of the motion-activated switch 410. The motion sensing component detects the movement of the person 402 and generates a motion trigger in response to detecting the movement. In some implementations, the motion trigger may wake up the motion-activated switch 410 from a low power mode. The motion-activated switch 410 activates the image capture component to begin capturing images of the environment in response to the motion trigger. Because the person 402 is exiting the environment, the motion-activated switch 410 may determine that the person 402 is absent from at least one of the captured images. As a result, the motion-activated switch 410 may turn off the overhead lighting 404 when the person 402 exits the environment.

Figure 5:
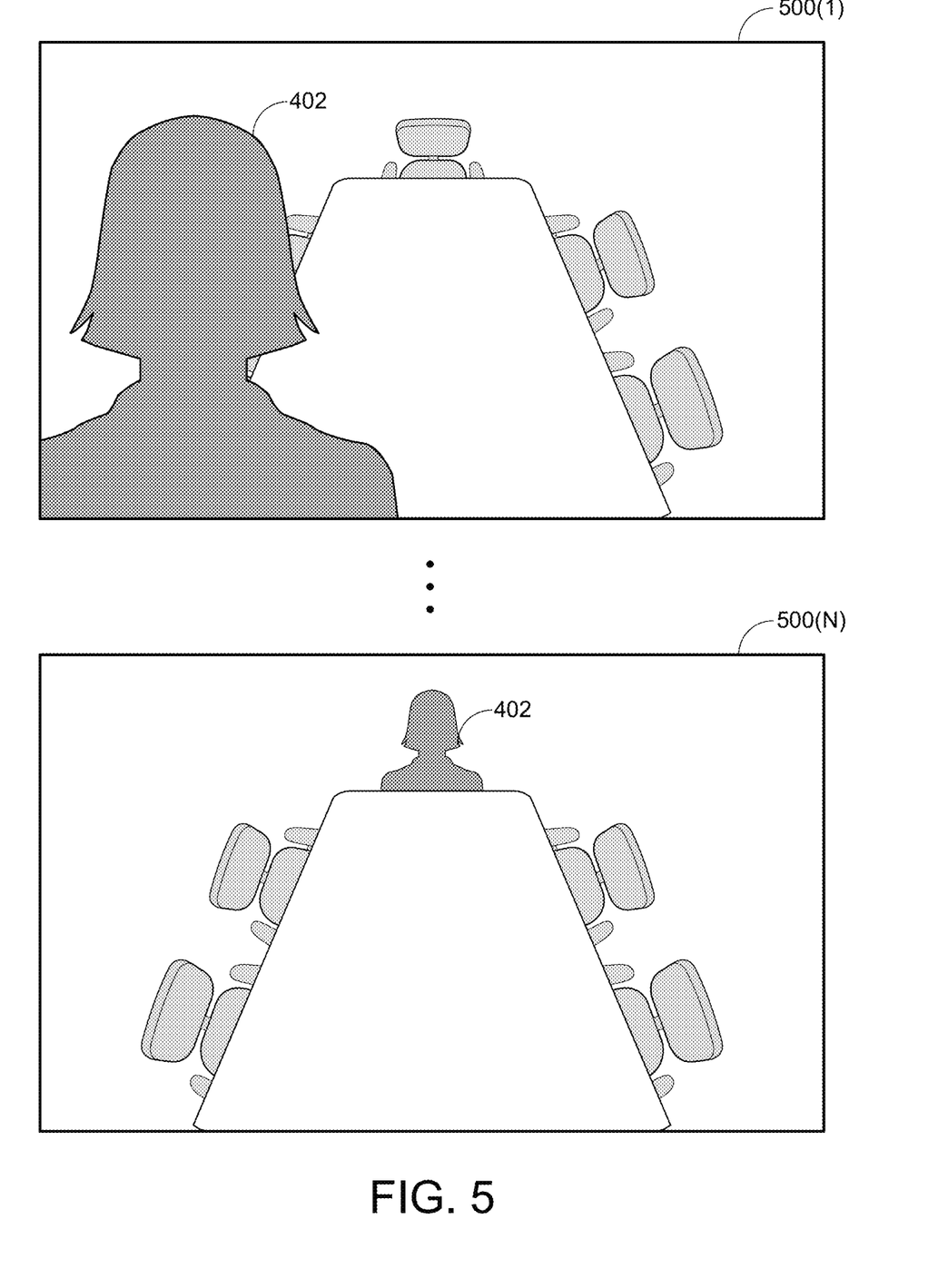
FIG. 5 shows a series of example images that can be captured by a motion-activated switch.

FIG. 5 shows a series of example images 500(1)-500(N) that can be captured by a motion-activated switch. In some implementations, the motion-activated switch may be one example of the motion-activated switch 410 of FIGS. 4A and 4B. With reference for example to FIGS. 4A and 4B, the series of images 500(1)-500(N) may be captured by the motion-activated switch 410 in response to detecting the person 402 entering the environment. More specifically, the first image 500(1) shows the environment when the person 402 first enters the FOV 412 of the motion sensing component (such as in FIG. 4A) and the $N^{th}$ image 500(N) shows the environment when the person 402 sits down at the table (such as in FIG. 4B).

In the example of FIG. 5, the motion-activated switch may detect the presence of the person 402 in each of the captured images 500(1)-500(N). In some implementations, the motion-activated switch may turn on one or more devices coupled to its relay (such as by closing the relay) in response to detecting the presence of the person 402 in the first image 500(1) and may refrain from turning off the devices (such as by maintaining the relay in the closed state) in response to detecting the presence of the person 402 in each of the remaining images 500(2)-500(N). In some implementations, the motion-activated switch may operate in a low power mode after capturing the series of images 500(1)-500(N). Because the person 402 is present in the $N^{th}$ image 500(N), the motion-activated switch may keep the devices coupled to its relay on even after entering the low power mode.

Figure 6:
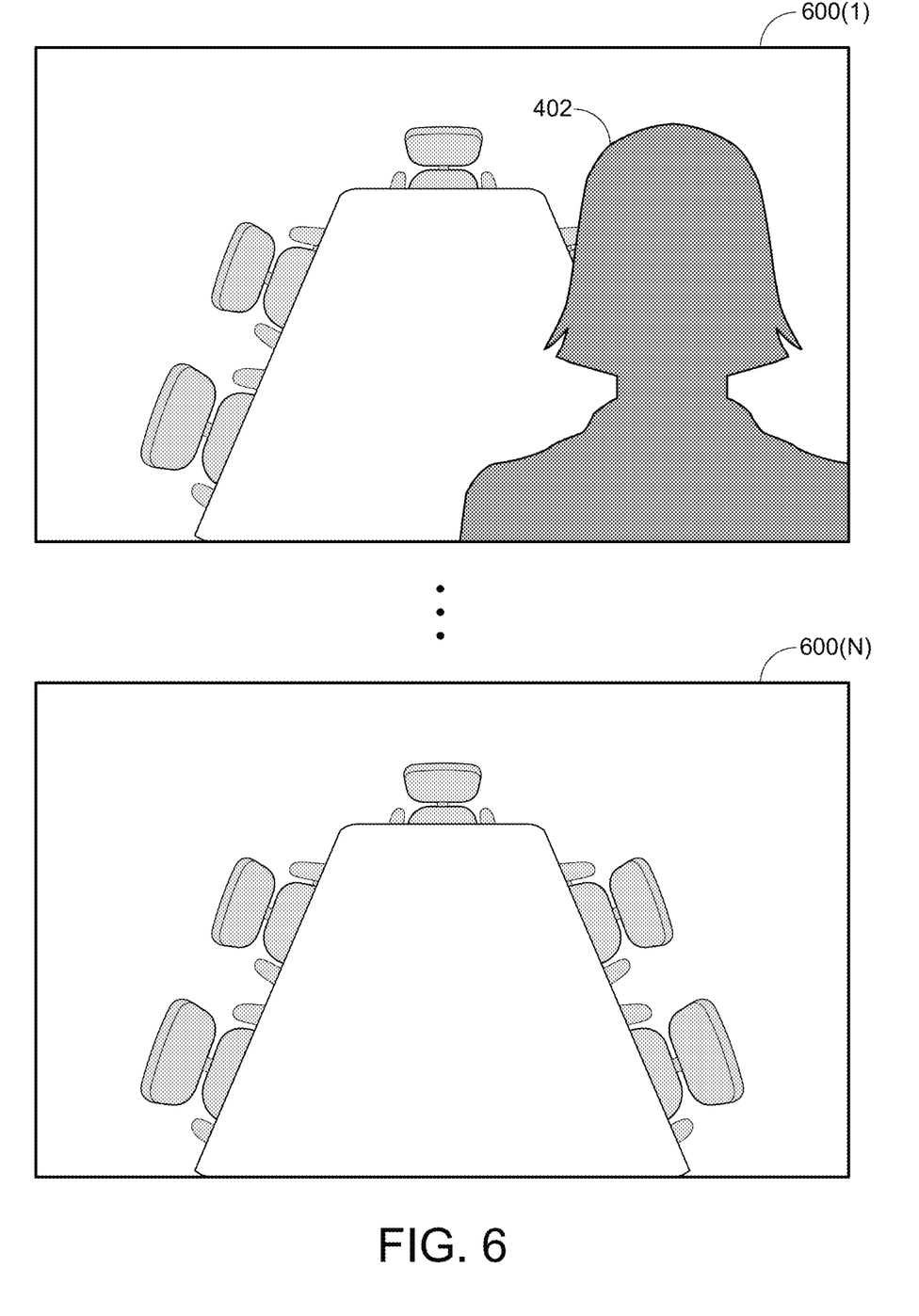
FIG. 6 shows another series of example images that can be captured by a motion-activated switch.

FIG. 6 shows another series of example images 600(1)-600(N) that can be captured by a motion-activated switch. In some implementations, the motion-activated switch may be one example of the motion-activated switch 410 of FIGS. 4A and 4B. With reference for example to FIGS. 4A and 4B, the series of images 600(1)-600(N) may be captured by the motion-activated switch 410 in response to detecting the person 402 exiting the environment. More specifically, the first image 600(1) shows the environment when the person 402 re-enters the FOV 412 of the motion sensing component and the $N^{th}$ image 600(N) shows the environment after the person 402 has left the environment.

In the example of FIG. 6, the motion-activated switch may detect the presence of the person 402 only in a subset of the captured images 600(1)-600(N). In some implementations, the motion-activated switch may refrain from turning off one or more devices coupled to its relay (such as by maintaining the relay in the closed state) in response to detecting the presence of the person 402 in the first image 600(1) and may turn off the devices (such as by opening the relay) in response to determining that no people are present in one or more of the remaining images 600(2)-600(N). In some implementations, the motion-activated switch may operate in a low power mode after capturing the series of images 600(1)-600(N). Because no people are present in the $N^{th}$ image 600(N), the motion-activated switch may keep the devices coupled to its relay off even after entering the low power mode.

Figure 7:
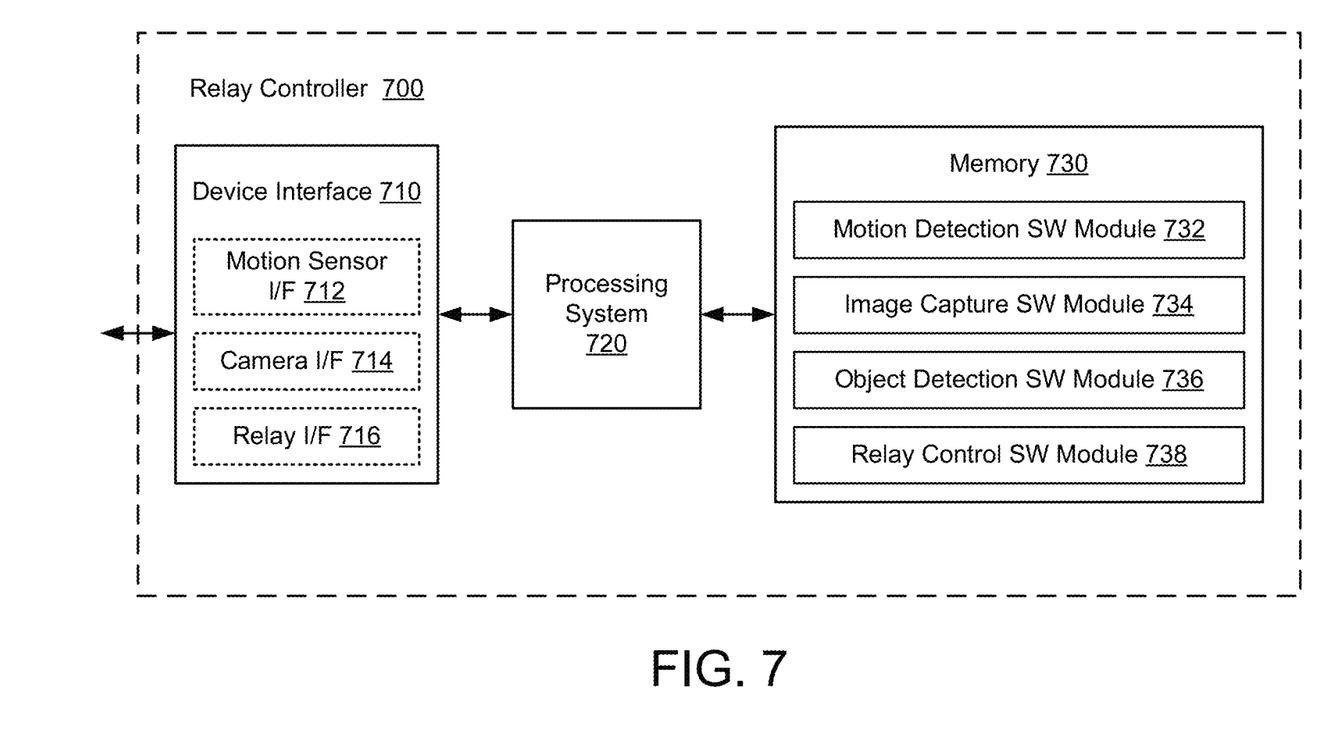
FIG. 7 shows a block diagram of a relay controller, according to some implementations.

FIG. 7 shows a block diagram of a relay controller 700 for a motion-activated switch, according to some implementations. In some implementations, the motion-activated switch may be one example of any of the motion-activated switches 110, 200, or 410 of FIGS. 1, 2, and 4, respectively. With reference for example to FIG. 2, the relay controller 700 may be one example of the relay controller 220. Thus, the relay controller 700 may be configured to selectively toggle a relay associated with the motion-activated switch based on a presence or absence of objects of interest in a given environment.

In some implementations, the relay controller 700 may include a device interface 710, a processing system 720, and a memory 730. The device interface 710 is configured to communicate with one or more components of the motion-activated switch. In some implementations, the device interface 710 may include a motion sensor interface (I/F) 712, a camera interface 714, and a relay interface 716. The motion sensor interface 712 may receive motion triggers output by a motion sensor of the motion-activated switch (such as the motion sensor 230). The camera interface 714 may output camera activation signals to, and receive captured images from, a camera of the motion-activated switch (such as the camera 240). The relay interface 716 may output control signals to a relay (such as the relay 210).

The memory 730 may include a non-transitory computer-readable medium (including one or more nonvolatile memory elements, such as EPROM, EEPROM, Flash memory, a hard drive, and the like) that may store at least the following software (SW) modules:
- a motion detection SW module 732 to receive a motion trigger indicating that motion is detected in an environment;
- an image capture SW module 734 to obtain one or more images of the environment based on the motion trigger;
- an object detection SW module 736 to perform an object detection operation that indicates whether the one or more images include an object of interest; and
- a relay control SW module 738 to selectively toggle a relay coupled to one or more devices associated with the environment based at least in part on the object detection operation.

Each software module includes instructions that, when executed by the processing system 720, causes the relay controller 700 to perform the corresponding functions.

The processing system 720 may include any suitable one or more processors capable of executing scripts or instructions of one or more software programs stored in the relay controller 700 (such as in memory 730). For example, the processing system 720 may execute the motion detection SW module 732 to receive a motion trigger indicating that motion is detected in an environment. The processing system 720 also may execute the image capture SW module 734 to obtain one or more images of the environment responsive to the motion trigger. Further, the processing system 720 may execute the object detection SW module 736 to perform an object detection operation that indicates whether the one or more images include an object of interest. Still further, the processing system 720 may execute the relay control SW module 738 to selectively toggle a relay coupled to one or more devices associated with the environment based at least in part on the object detection operation.

Figure 8:
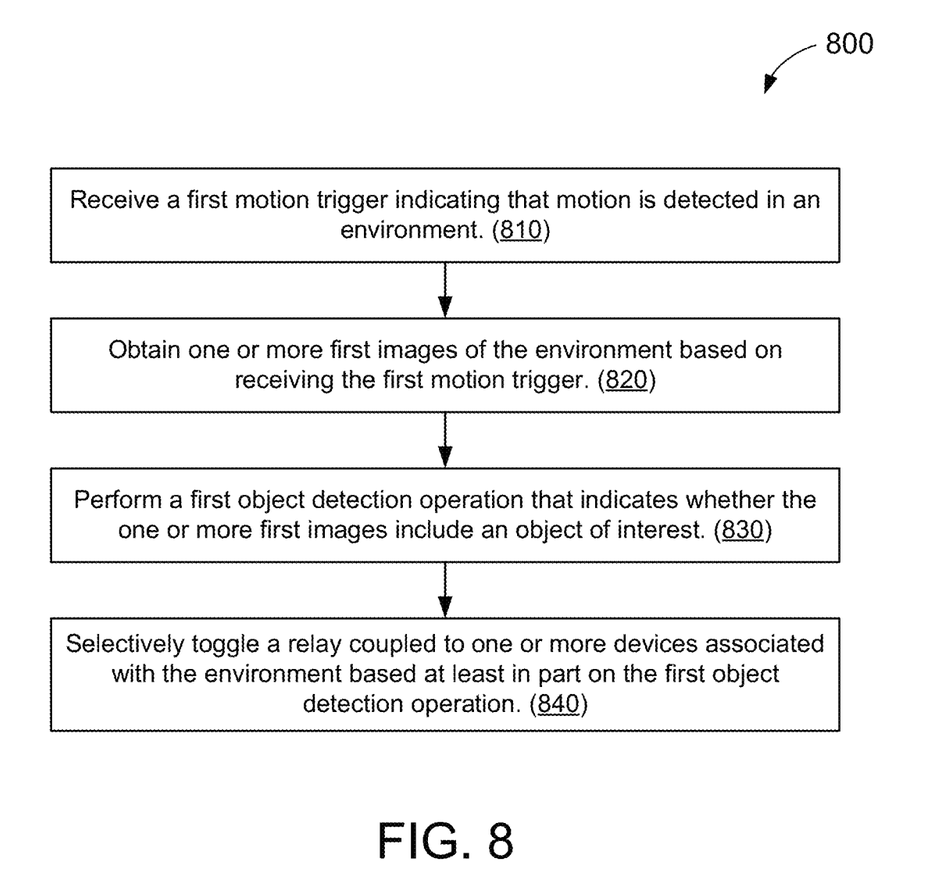
FIG. 8 shows an illustrative flowchart depicting an example operation for controlling a motion-activated switch, according to some implementations.

FIG. 8 shows an illustrative flowchart depicting an example operation 800 for controlling a motion-activated switch, according to some implementations. In some implementations, the example operation 800 may be performed by a relay controller for the motion-activated switch (such as any of the relay controllers 220 or 700 of FIGS. 2 and 7, respectively).

The relay controller may receive a first motion trigger indicating that motion is detected in an environment (810). The relay controller may obtain one or more first images of the environment based on the first motion trigger (820). The relay controller may further perform a first object detection operation that indicates whether the one or more first images include an object of interest (830). The relay controller may further selectively toggle a relay coupled to one or more devices associated with the environment based at least in part on the first object detection operation (840). In some implementations, the one or more devices may include one or more lighting elements configured to illuminate the environment.

In some implementations, the relay controller may selectively toggle the relay by closing the relay responsive to the first object detection operation indicating that at least one of the one or more first images includes an object of interest. In such implementations, the closing of the relay may couple the one or more devices to a power supply. In some other implementations, the relay controller may selectively toggle the relay by opening the relay responsive to the first object detection operation indicating that at least one of the one or more first images does not include an object of interest. In such implementations, the opening of the relay may decouple the one or more devices from a power supply.

In some aspects, the relay controller may further operate in a low power mode after a threshold duration following the reception of the first motion trigger. In some implementations, the one or more first images may span the threshold duration. In some implementations, the relay controller may further receive a second motion trigger indicating that motion is detected in the environment; wake up from the low power mode responsive to receiving the second motion trigger; obtain one or more second images of the environment responsive to waking from the low power mode; perform a second object detection operation that indicates whether the one or more second images include an object of interest; and selectively toggle the relay based at least in part on the second object detection operation.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method performed by a relay controller, comprising:
   receiving a first motion trigger indicating that motion is detected in an environment;
   obtaining one or more first images of the environment based on the first motion trigger;

performing a first object detection operation that indicates whether the one or more first images include an object of interest; and selectively toggling a relay coupled to one or more devices associated with the environment based at least in part on the first object detection operation, wherein the selective toggling of the relay includes:

closing the relay responsive to the first object detection operation indicating that at least one of the one or more first images includes an object of interest, wherein the closing of the relay couples the one or more devices to a power supply.

2. The method of claim 1, wherein the obtaining of the one or more first images comprises:

activating a camera responsive to receiving the first motion trigger; and receiving the one or more first images from the camera.

3. The method of claim 1, wherein the selective toggling of the relay further includes:

opening the relay responsive to the first object detection operation indicating that at least one of the one or more first images does not include an object of interest.

4. The method of claim 3, wherein the opening of the relay decouples the one or more devices from a power supply.

5. The method of claim 1, further comprising:

operating in a low power mode after a threshold duration following the reception of the first motion trigger.

6. The method of claim 5, wherein the one or more first images span the threshold duration.

7. The method of claim 5, further comprising:

receiving a second motion trigger indicating that motion is detected in the environment;

waking up from the low power mode responsive to receiving the second motion trigger;

obtaining one or more second images of the environment responsive to waking from the low power mode;

performing a second object detection operation that indicates whether the one or more second images include an object of interest; and selectively toggling the relay based at least in part on the second object detection operation.

8. A relay controller comprising:

a processing system; and a memory storing instructions that, when executed by the processing system, causes the relay controller to:

receive a first motion trigger indicating that motion is detected in an environment;

obtain one or more first images of the environment based on the first motion trigger;

perform a first object detection operation that indicates whether the one or more first images include an object of interest; and selectively toggle a relay coupled to one or more devices associated with the environment based at least in part on the first object detection operation, wherein the selective toggling of the relay includes:

closing the relay responsive to the first object detection operation indicating that at least one of the one or more first images includes an object of interest, wherein the closing of the relay couples the one or more devices to a power supply.

9. The relay controller of claim 8, wherein the selective toggling of the relay further includes:

opening the relay responsive to the first object detection operation indicating that at least one of the one or more first images does not include an object of interest.

10. The relay controller of claim 9, wherein the opening of the relay decouples the one or more devices from a power supply.

11. The relay controller of claim 8, wherein execution of the instructions further causes the relay controller to:

operate in a low power mode after a threshold duration following the reception of the first motion trigger.

12. The relay controller of claim 11, wherein the one or more first images span the threshold duration.

13. The relay controller of claim 11, wherein execution of the instructions further causes the relay controller to:

receive a second motion trigger indicating that motion is detected in the environment;

wake up from the low power mode responsive to receiving the second motion trigger;

obtain one or more second images of the environment responsive to waking from the low power mode;

perform a second object detection operation that indicates whether the one or more second images include an object of interest; and selectively toggle the relay based at least in part on the second object detection operation.

14. A system comprising:

a relay coupled to one or more devices associated with an environment;

a motion sensor configured to detect motion in the environment;

a camera configured to capture images of the environment; and a relay controller configured to:

receive, from the motion sensor, a motion trigger indicating that motion is detected in the environment;

obtain, via the camera, one or more images of the environment responsive to receiving the motion trigger;

performing an object detection operation that indicates whether the one or more images include an object of interest; and close the relay responsive to the object detection operation indicating that at least one of the one or more images includes an object of interest, wherein the closing of the relay couples the one or more devices to a power source.

15. The system of claim 14, wherein the one or more devices include one or more lighting elements configured to illuminate the environment.

16. The system of claim 14, wherein the relay controller is further configured to:

open the relay responsive to the object detection operation indicating that at least one of the one or more images does not include an object of interest, wherein the opening of the relay decouples the one or more devices from the power source.

* * * * *